US009293970B2

(12) United States Patent
Nakai et al.

(10) Patent No.: US 9,293,970 B2
(45) Date of Patent: Mar. 22, 2016

(54) CONTROL DEVICE AND MOTOR UNIT INCLUDING THE CONTROL DEVICE

(71) Applicant: JTEKT CORPORATION, Osaka-shi, Osaka (JP)

(72) Inventors: Motoo Nakai, Nara (JP); Yasuyuki Wakita, Kashihara (JP)

(73) Assignee: JTEKT CORPORATION, Osaka (JP)

( * ) Notice: Subject to any disclaimer, the term of this patent is extended or adjusted under 35 U.S.C. 154(b) by 288 days.

(21) Appl. No.: 14/025,000

(22) Filed: Sep. 12, 2013

(65) Prior Publication Data

US 2014/0077638 A1    Mar. 20, 2014

(30) Foreign Application Priority Data

Sep. 19, 2012  (JP) .................................. 2012-206019

(51) Int. Cl.
| | |
|---|---|
| H02K 11/00 | (2006.01) |
| B62D 5/04 | (2006.01) |
| H05K 1/02 | (2006.01) |
| H05K 1/18 | (2006.01) |
| H02K 5/22 | (2006.01) |
| H05K 3/00 | (2006.01) |
| H05K 3/46 | (2006.01) |

(52) U.S. Cl.
CPC .......... *H02K 11/0073* (2013.01); *B62D 5/0406* (2013.01); *H02K 5/225* (2013.01); *H02K 11/0084* (2013.01); *H05K 1/0203* (2013.01); *H05K 1/0263* (2013.01); *H05K 1/185* (2013.01); *H01L 2924/0002* (2013.01); *H02K 2203/03* (2013.01); *H05K 3/0058* (2013.01); *H05K 3/4632* (2013.01); *H05K 2201/10166* (2013.01); *H05K 2201/2009* (2013.01)

(58) Field of Classification Search
CPC . H02K 11/0084; H02K 1/185; B62D 5/0406; H05K 1/0263; H05K 3/0058
USPC ........... 310/68 A, 68 B, 68 C, 68 D, 68 R, 71
See application file for complete search history.

(56) References Cited

U.S. PATENT DOCUMENTS

| | | | |
|---|---|---|---|
| 6,577,030 B2 * | 6/2003 | Tominaga et al. | .......... 310/68 B |
| 2005/0000725 A1 | 1/2005 | Shiraishi et al. | |
| 2007/0205038 A1 | 9/2007 | Tominaga et al. | |
| 2011/0303442 A1 * | 12/2011 | Chen | ............................. 174/255 |
| 2012/0313467 A1 * | 12/2012 | Omae et al. | ..................... 310/71 |

FOREIGN PATENT DOCUMENTS

| | | |
|---|---|---|
| JP | A-2002-374067 | 12/2002 |
| JP | 2011-214432 A | 10/2011 |
| WO | 2012/117872 A1 | 9/2012 |

OTHER PUBLICATIONS

May 12, 2015 Extended Search Report issued in European Patent Application No. 13184555.4.

* cited by examiner

*Primary Examiner* — Hanh Nguyen
(74) *Attorney, Agent, or Firm* — Oliff PLC

(57) ABSTRACT

A control device of a motor unit has a gear housing having a supporting wall portion, a ceramic portion formed on the supporting wall portion, a circuit board body fixed to the ceramic portion, a power element located inside the circuit board body, and a load receiving member that is located around the power element inside the circuit board body and receives a load applied to the circuit board body.

6 Claims, 3 Drawing Sheets

CONTROL DEVICE AND MOTOR UNIT INCLUDING THE CONTROL DEVICE

INCORPORATION BY REFERENCE/RELATED APPLICATION

This application claims priority to Japanese Patent Application No. 2012-206019 filed on Sep. 19, 2012 the disclosure of which, including the specification, drawings and abstract, is incorporated herein by reference in its entirety.

BACKGROUND OF THE INVENTION

1. Field of the Invention

The invention relates to a control device having a circuit board body fitted to a housing, and a motor unit including the control device.

2. Discussion of Background

A circuit board described in US 2005/0000725 A1 has a configuration in which a circuit board body, which is a multilayer printed circuit board, is bonded to a ceramic portion. The circuit board also has a configuration in which circuit elements are mounted on a surface of the circuit board body, which is on the opposite side of the circuit board body from the surface thereof facing the ceramic portion. The circuit elements are electrically connected to metal portions of the ceramic portion via conductor patterns and conductive portions that are located inside the circuit board body.

The circuit board is configured such that the circuit elements are mounted on the surface of the circuit board body. Therefore, the heat of the circuit elements is transferred to the ceramic portion through all the layers of the circuit board body. Accordingly, the heat of the circuit elements is not easily transferred to the ceramic portion.

SUMMARY OF THE INVENTION

The invention provides a control device configured such that the heat of circuit elements are easily transferred to a ceramic portion, and a motor unit including the control device.

According to a feature of an example of the invention, there is provided a control device including: housing that has a supporting wall portion; and a circuit board that has a ceramic portion formed on the supporting wall portion, a circuit board body fixed to the ceramic portion, a circuit element positioned inside the circuit board body, and a load receiving member that is positioned around the circuit element inside the circuit board body and receives a load applied to the circuit board body.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein.

DETAILED DESCRIPTION OF EMBODIMENTS

Hereinafter, embodiments of the invention will be described with reference to the accompanying drawings.

Figure 1:
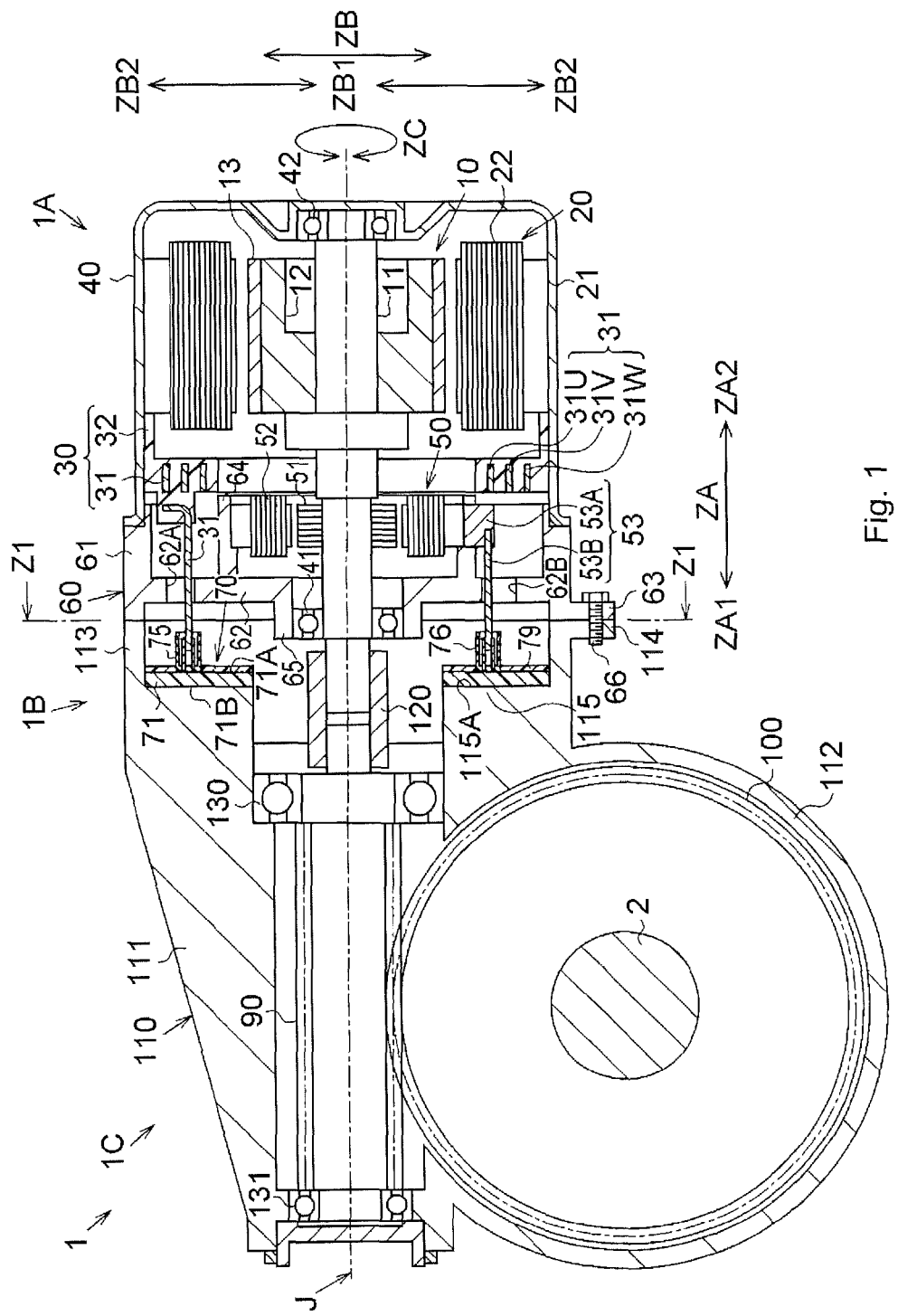
FIG. 1 is a sectional view illustrating the sectional structure of a motor unit according to an embodiment of the invention, taken along the axial direction of the motor unit.

With reference to FIG. 1, the configuration of a motor unit 1 according to an embodiment of the invention will be described. The motor unit 1 according to the present embodiment is applied to an electric power steering system (hereinafter, referred to as "EPS"). The EPS detects steering torque applied when a driver operates a steering member (not shown), and controls an electric motor 1A of the motor unit 1 so as to generate assist torque based on the steering torque. The EPS transmits the rotation of the steering member to a rack-and-pinion mechanism (not shown) through a steering shaft 2, and converts the rotation into a reciprocating motion of a rack shaft (not shown).

The motor unit 1 includes the electric motor 1A, a control device 1B, and a speed reducer 1C. The control device 1B is located between the electric motor 1A and the speed reducer 1C. The control device 1B controls the operation of the electric motor 1A. The speed reducer 1C reduces the speed of rotation received from an output shaft 11 of the electric motor 1A, and transmits the rotary torque of the output shaft 11 to the steering shaft 2.

The electric motor 1A has a rotor 10, a stator 20, a bus bar 30, a motor housing 40, bearings 41, 42, a resolver 50, and a motor bracket 60. The control device 1B includes a circuit board 70. The speed reducer 1C includes a worm shaft 90, a worm wheel 100, a gear housing 110, and bearings 130, 131. In the present embodiment, the gear housing 110 serves as housing, which is a component of the control device 1B, and serves also as a component of the speed reducer 1C.

Directions related to the motor unit 1 will be defined as follows.

(A) The directions along the rotation central axis of the rotor 10 (hereinafter, referred to as "rotation axis J") will be referred to as "axial directions ZA". The directions orthogonal to the axial directions ZA will be referred to as "radial directions ZB". The directions in which the rotor 10 rotates will be referred to as "circumferential directions ZC".

(B) Among the axial directions ZA, the direction along which the electric motor 1A, the control device 1B, and the speed reducer 1C are arranged in this order will be referred to as "upward direction ZA1". On the other hand, among the axial directions ZA, the direction along which the speed reducer 1C, the control device 1B, and the electric motor 1A are arranged in this order will be referred to as "downward direction ZA2".

(C) Among the radial directions ZB, directions toward the rotation axis J will be referred to as "radially inward directions ZB1". On the other hand, among the radial directions ZB, directions away from the rotation axis J will be referred to as "radially outward directions ZB2".

The rotor 10 includes the output shaft 11, a rotor core 12, and permanent magnets 13. The rotor core 12 is press-fitted onto the output shaft 11. The permanent magnets 13 are fixed to an outer peripheral face of the rotor core 12. The permanent magnets 13 have ten magnetic poles arranged in the circumferential directions ZC in the embodiment.

The stator 20 has a stator core 21 and a field portion 22. Upon reception of current from an electric power supply (not shown), the stator 20 forms a magnetic field that causes the rotor 10 to generate torque. The stator core 21 is press-fitted to an inner peripheral face of the motor housing 40. In the field portion 22, a concentrated winding is formed by winding conductive wires at the stator core 21. The field portion 22 has four U-phase coils, four V-phase coils, and four W-phase coils.

The bus bar 30 has a copper plate 31 and a supporting member 32. The bus bar 30 is located above the stator core 21 in the upward direction ZA1. The bus bar 30 electrically connects the stator 20 and the circuit board 70 to each other.

The copper plate 31 has a U-phase copper plate 31U, a V-phase copper plate 31V and a W-phase copper plate 31W. A coil end portion of each U-phase coil is connected to the U-phase copper plate 31U. A coil end portion of each V-phase coil is connected to the V-phase copper plate 31V. A coil end portion of each W-phase coil is connected to the W-phase copper plate 31W. End portions of the U-phase copper plate 31U, the V-phase copper plate 31V, and the W-phase copper plate 31W extend in the upward direction ZA1, and are connected to the circuit board 70. The supporting member 32 supports the copper plate 31. The supporting member 32 is attached at its lower end portion to an outer peripheral portion of the stator core 21.

The motor housing 40 has a cylindrical shape that is closed in the downward direction ZA2 and that is open in the upward direction ZA1. The motor housing 40 houses a portion of the rotor 10, the stator 20, the bus bar 30 and the bearing 42. A lower end portion of the motor housing 40 supports the bearing 42.

The resolver 50 is located above the bus bar 30 in the upward direction ZA1, and inward of the bus bar 30 in the inward directions ZB1. The resolver 50 outputs, to the circuit board 70, a voltage signal corresponding to the rotational position of the rotor 10. The resolver 50 has a resolver rotor 51, a resolver stator 52, and a circuit connection member 53. The resolver 50 is configured as a variable reluctance resolver.

The resolver rotor 51 is press-fitted onto the output shaft 11. The resolver stator 52 is fixed to a resolver supporting portion 64 of the motor bracket 60. The circuit connection member 53 has a terminal block 53A and a plurality of connection terminals 53B. The circuit connection member 53 electrically connects the resolver stator 52 and the circuit board 70 to each other. The terminal block 53A is made of a resin material. The terminal block 53A protrudes from the resolver stator 52 in the radially outward directions ZB2 beyond the resolver supporting portion 64 of the motor bracket 60. The connection terminals 53B extend from the terminal block 53A in the upward direction ZA1.

The motor bracket 60 has a side wall 61, a bottom wall 62, fitting portions 63, the resolver supporting portion 64, and a bearing supporting portion 65. The motor bracket 60 supports the bearing 41 at the bearing supporting portion 65.

The side wall 61 has a cylindrical shape. The side wall 61 is fixed to an upper end portion of the motor housing 40. The bottom wall 62 is provided above the motor housing 40 in the upward direction ZA1. The bottom wall 62 has a bus bar through-hole 62A and a resolver through-hole 62B. The fitting portions 63 are fixed to fitting portions 114 of the gear housing 110 with bolts 66. The resolver supporting portion 64 extends from the bottom wall 62 in the downward direction ZA2. The bearing supporting portion 65 extends from the bottom wall 62 in the upward direction ZA1.

Figure 2:
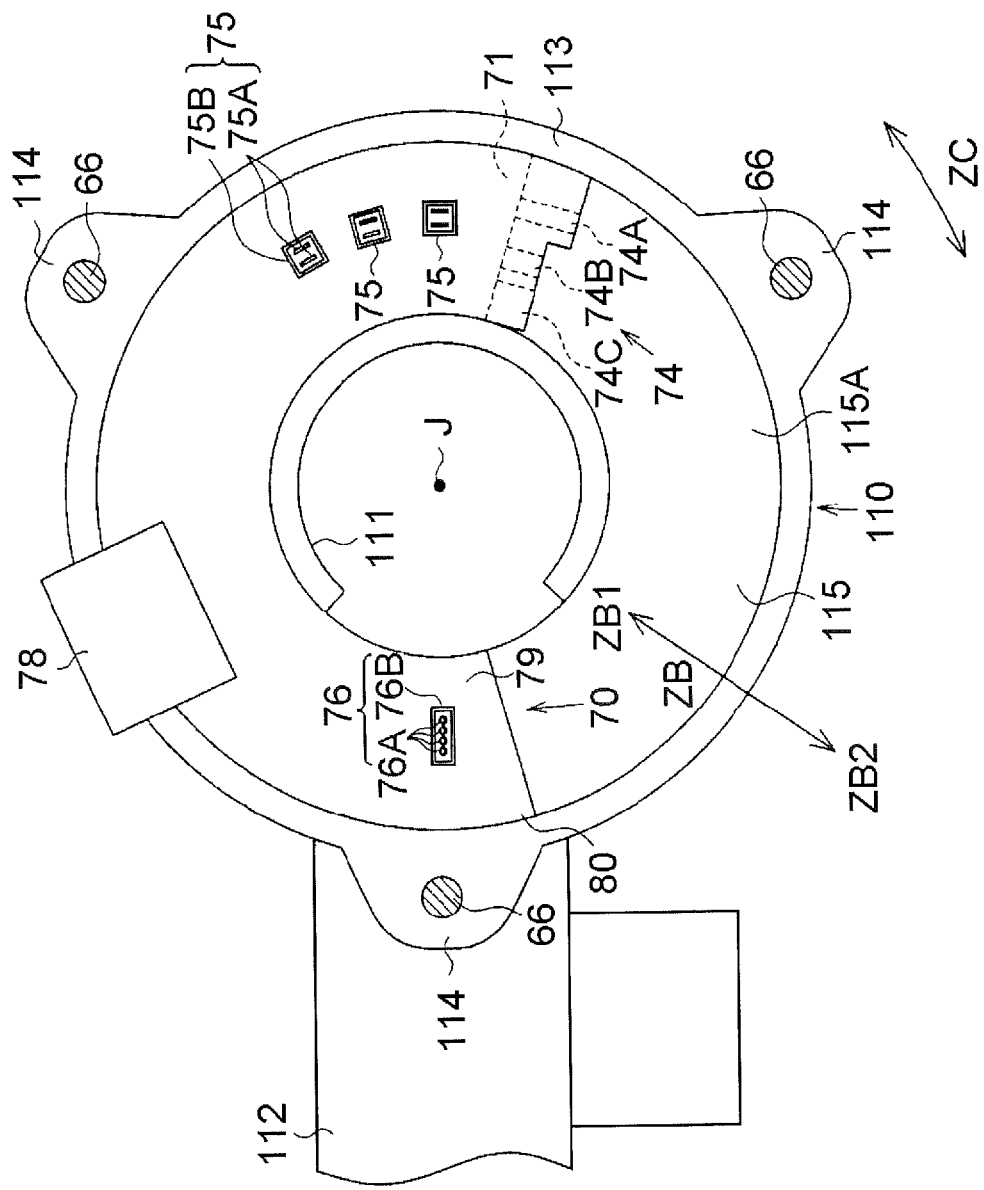
FIG. 2 is a sectional view taken along the line Z1-Z1 in FIG. 1.

The circuit board 70 is shaped like a circular plate in a bottom view of the gear housing 110 (refer to FIG. 2). The circuit board 70 is parallel to a plane that is orthogonal to the rotation axis J. The circuit board 70 is fixed to a lower surface 115A of a supporting wall portion 115 of the gear housing 110.

The worm shaft 90 rotates together with the output shaft 11. The worm shaft 90 meshes with the worm wheel 100. The worm shaft 90 is connected to the output shaft 11 by a coupling 120 fixed at the lower end of the worm shaft 90.

The worm wheel 100 is fixed to the steering shaft 2. The worm wheel 100 transmits the rotation of the worm shaft 90 to the steering shaft 2. The gear housing 110 is made of a metal material. The gear housing 110 has a shaft housing portion 111, a wheel housing portion 112, a side wall 113, and the fitting portions 114. In the gear housing 110, the bearings 130, 131 are fitted to the shaft housing portion 111.

The shaft housing portion 111 houses the worm shaft 90. An end portion of the shaft housing portion 111 in the downward direction ZA2 supports the bearing 130, and an upper end portion of the shaft housing portion 111 supports the bearing 131. The shaft housing portion 111 has the supporting wall portion 115 at the lower end thereof. The supporting wall portion 115 has the lower surface 115A formed of a surface orthogonal to the rotation axis J. The wheel housing portion 112 houses the worm wheel 100 and part of the steering shaft 2. The side wall 113 has a cylindrical shape. The side wall 113 is positioned at the lower end of the gear housing 110. The fitting portions 114 extend from the lower end of the side wall 113 in the outward directions ZB2.

Figure 3A:
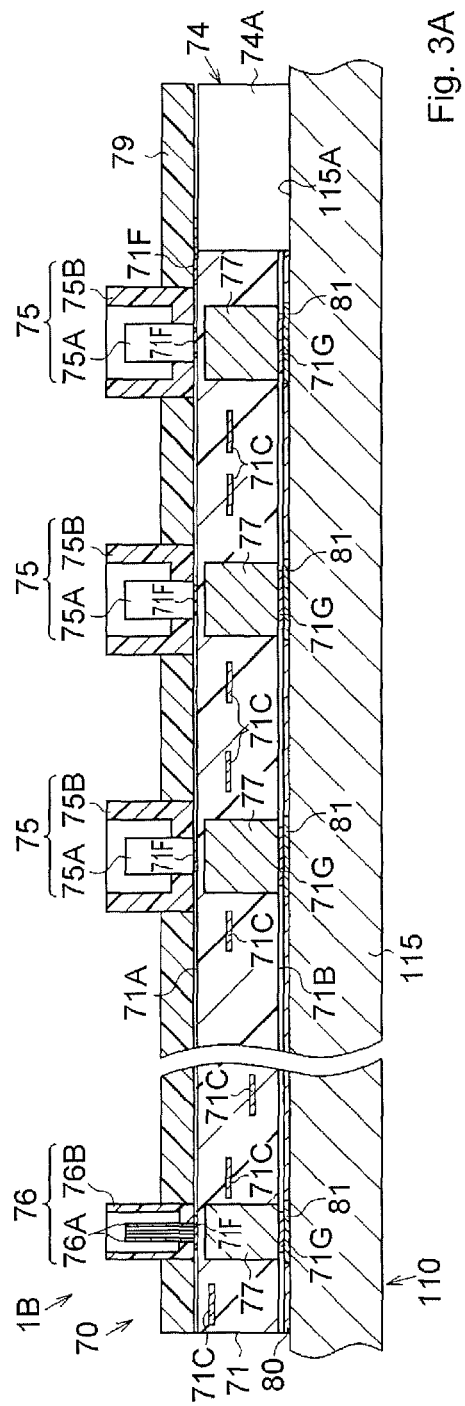
FIG. 3A is a sectional view illustrating the sectional structure of connectors and their surroundings.
Figure 3B:
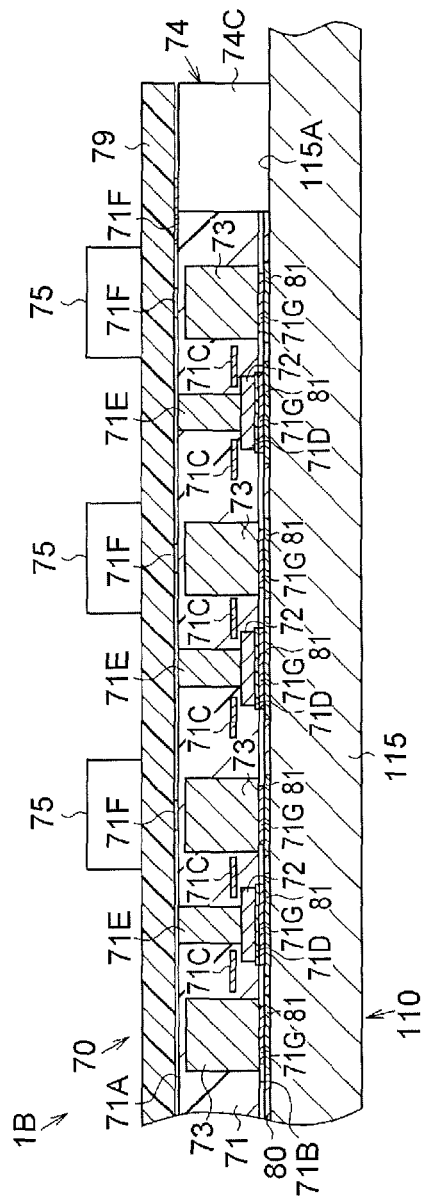
FIG. 3B is a sectional view illustrating the sectional structure of power elements and their surroundings.

With reference to FIG. 3A and FIG. 3B, the detailed configuration of the circuit board 70 will be described. As illustrated in FIG. 3A, the circuit board 70 has a circuit board body 71, field-effect transistors serving as six power elements 72 (refer to FIG. 3B), eleven load receiving members 73 (refer to FIG. 3B), three control elements 74, three bus bar connectors 75, one resolver connector 76, four terminal supporting members 77, one external connector 78 (refer to FIG. 2), a resin covering portion 79, and a ceramic portion 80. In the circuit board 70, the six power elements 72 constitute an inverter circuit that controls driving of the electric motor 1A (refer to FIG. 1), and circuit elements such as the control elements 74 constitute a control circuit that controls operations of the power elements 72. Note that, the power elements 72 may function as "circuit elements".

The circuit board body 71 has a main surface 71A, a back surface 71B, conductor patterns 71C, conductive portions 71D (refer to FIG. 3B), inter-layer connection portions 71E (refer to FIG. 3B), main surface metal junction portions 71F, and back surface metal junction portions 71G. The circuit board body 71 is formed as a multi-layer printed board formed by performing thermocompression bonding on stacked thermoplastic resin films on each of which the conductor patterns 71C are formed. The circuit board body 71 has a configuration in which the bus bar connectors 75, the resolver connector 76, and the external connector 78 are mounted on the main surface 71A. The circuit board body 71 is fixed to the ceramic portion 80, at the back surface 71B, which is formed on the opposite side of the circuit board body 71 from the main surface 71A.

The conductor patterns 71C electrically connect the circuit elements, such as the power elements 72, attached to the circuit board body 71. The conductor patterns 71C are formed on each layer of the circuit board body 71.

The conductive portions 71D are located at portions within the circuit board body 71, which correspond to the power elements 72. The conductive portions 71D are located between the power elements 72 and the back surface 71B. Each inter-layer connection portion 71E is formed of a via hole and conductive paste that fills the via hole. The inter-layer connection portions 71E electrically connect the conductor patterns 71C of the layers of the circuit board body 71.

The main surface metal junction portions 71F are formed on the main surface 71A of the circuit board body 71. The main surface metal junction portions 71F are electrically connected to connection terminals 75A of the bus bar connectors 75, connection terminals 76A of the resolver connector 76, and the control elements 74.

The back surface metal junction portions 71G are formed on the back surface 71B of the circuit board body 71. The back surface metal junction portions 71G are located at portions of the circuit board body 71, which correspond to the conductive portions 71D, the load receiving members 73, and the terminal supporting members 77. The back surface metal junction portions 71G are in contact with the conductive portions 71D, the load receiving members 73, and the terminal supporting members 77. The back surface metal portions 71G may function as "metal junction portions".

The power elements 72 are located within the circuit board body 71, at positions on the back surface 71B side. The power elements 72 are electrically connected to the conductive portions 71D. The load receiving members 73 are made of a metal material. The load receiving members 73 have a columnar shape. The load receiving members 73 are located around each of the power elements 72 within the circuit board body 71. One end of each load receiving member 73 is located at a position that is within the circuit board body 71 and that is at the back surface 71B-side end portion of the circuit board body 71. The other end of each load receiving member 73 is located at a position that is within the circuit board body 71 and that is closer to the main surface 71A than the power elements 72.

The terminal supporting members 77 are located at portions within the circuit board body 71, which correspond to the bus bar connectors 75 and the resolver connector 76. The terminal supporting members 77 extend from the back surface 71B-side end portion of the circuit board body 71 toward the main surface 71A-side end portion of the circuit board body 71. The three terminal supporting members 77 corresponding to the bus bar connectors 75 have a rectangular columnar shape. The one terminal supporting member 77 corresponding to the resolver connector 76 has a rectangular columnar shape.

The resin covering portion 79 covers the whole main surface 71A of the circuit board body 71 from the main surface 71A side. The resin covering portion 79 covers the circuit elements (not shown) fitted to the main surface 71A of the circuit board body 71. The resin covering portion 79 restrains electrical conduction between the main surface metal junction portions 71F and circuit elements (not shown) joined to the main surface metal junction portions 71F by wire bonding, from becoming unstable due to changes in the ambient temperature of the circuit board 70. The resin covering portion 79 covers the circuit board body 71 to restrain adhesion of dust and water droplets onto the circuit board body 71.

The ceramic portion 80 is made of alumina. The ceramic portion 80 constitutes a thin film formed on the lower surface 115A of the supporting wall portion 115 of the gear housing 110. The ceramic portion 80 has conductive portions 81 at the positions corresponding to the back surface metal junction portions 71G. The conductive portions 81 are in contact with the back surface metal junction portions 71G and the lower surface 115A of the supporting wall portion 115.

The control elements 74 are adjacent to a side surface that is perpendicular to the main surface 71A and the back surface 71B of the circuit board body 71. The control elements 74 are arranged in the radial directions ZB (see FIG. 2). The control elements 74 include a film capacitor 74A, a toroidal coil 74B, and a relay 74C (which are shown in FIG. 2). The film capacitor 74A, the toroidal coil 74B and the relay 74C are bonded to the main surface metal junction portion 71F of the circuit board body 71 by wire bonding.

The bus bar connectors 75 are arranged at predetermined intervals in the circumferential direction ZC (refer to FIG. 2). Each of the bus bar connectors 75 has the connection terminals 75A and a connector case 75B. The connection terminals 75A rise from the main surface 71A of the circuit board body 71. The connection terminals 75A include a pair of copper plates between which the copper plate 31 of the bus bar 30 is sandwiched (refer to FIG. 1). Each connector case 75B has a square shape in a plan view, and has a box shape so as to house the connection terminals 75A.

The resolver connector 76 has the connection terminals 76A and a connector case 76B. The connection terminals 76A rise from the main surface 71A of the circuit board body 71. The connection terminals 76A have a cylindrical shape so that the connection terminals 53B of the resolver 50 (refer to FIG. 1) are fitted to the connection terminals 76A. The connection terminals 76A are arranged in the radial directions ZB. The connector case 76B has a rectangular shape of which the long sides extend in the radial directions ZB in a plan view, and has a box shape so as to house the connection terminals 76A.

The external connector 78 connects an external power supply (not shown) and the circuit board 70 to each other. The external connector 78 projects in the radially outward direction ZB2 from the side wall 113 of the gear housing 110 in a state wherein the external connector 78 is curved from the circuit board body 71 (refer to FIG. 2).

With reference to FIG. 1 and FIG. 3, a manufacturing method for the motor unit 1 will be described. The manufacturing method for the motor unit 1 includes a resin molding step, a ceramic formation step, a board junction step, and a housing fixation step.

In the resin molding step, the resin covering portion 79 is formed on the main surface 71A side of the circuit board body 71 by resin molding. In the ceramic formation step, the ceramic portion 80 is formed on the lower surface 115A of the supporting wall portion 115 by aerosol deposition.

In the board junction step, the circuit board 70 and the supporting wall portion 115 of the gear housing 110 are pressurized while being heated by a vacuum heating press. Thus, the back surface metal junction portions 71G and the conductive portions 81 of the ceramic portion 80 are joined to each other. That is, the circuit board body 71 is fixed to the ceramic portion 80.

In the housing fixation step, the worm shaft 90 is press-fitted onto the output shaft 11, to which the coupling 120 has been fixed. At this time, an end of the bus bar 30 is fitted to the bus bar connectors 75, while the connection terminals 53B of the resolver 50 are fitted to the resolver connector 76. Then, the fitting portions 114 and the fitting portions 63 are fixed together with the bolts 66. Thus, the gear housing 110 is fixed to the motor bracket 60.

With reference to FIG. 3, the operation of the control device 1B will be described. The control device 1B has a first to a third functions. The first function refers to a function of suppressing application of excess load to the power elements 72. The second function refers to a function of suppressing excessive deformation of the circuit board body 71. The third function refers to a function of increasing the amount of heat that is transferred from the power elements 72 to the outside.

The first function of the control device 1B will be described. As illustrated in FIG. 3B, the load receiving members 73 are located around each power element 72 within the circuit board body 71. Therefore, in the board junction step, when the circuit board 70 is pressurized toward the ceramic portion 80 by the vacuum hot press machine, the load applied to the circuit board body 71 is received by the load receiving members 73, at the positions around the power elements 72. Therefore, the load applied to the circuit board body 71 is restrained from acting on the power elements 72.

The second function of the control device 1B will be described. As illustrated in FIG. 3A, in the housing fixation step, when the ends of the copper plate 31 of the bus bar 30 (refer to FIG. 1) are fitted to the connection terminals 75A of the bus bar connectors 75, a load is applied through the connection terminals 75A in a direction from the main surface 71A of the circuit board body 7 toward the back surface 71B of the circuit board body 71. Meanwhile, the terminal supporting members 77 are located at the portions inside the circuit board body 71, which correspond to the bus bar connectors 75. Therefore, the load applied to the circuit board body 71 through the connection terminals 75A is received by the terminal supporting members 77. Therefore, it is possible to restrain the circuit board body 71 from being deformed by the load applied to the circuit board body 71 through the connection terminals 75A.

The third function of the control device 1B will be described. When the motor unit 1 is driven, the power elements 72 generate heat. As illustrated in FIG. 3B, the heat of the power elements 72 is transferred to the conductive portions 81 of the ceramic portion 80 through the conductive portions 71D and the back surface metal junction portions 71G. The heat transferred to the conductive portions 81 is further transferred to the supporting wall portion 115 of the gear housing 110. Therefore, the heat of the power elements 72 is transferred to the ceramic portion 80 more easily than it would if the power elements 72 were mounted on the main surface 71A of the circuit board body 71.

The motor unit 1 according to the invention provides the following advantageous effects.

(1) The circuit board 70 is configured such that the power elements 72 are located inside the circuit board body 71. With this configuration, the distance between the power elements 72 and the ceramic portion 80 is shorter than that in the case where the power elements 72 are mounted on the main surface 71A of the circuit board body 71. Therefore, the heat of the power elements 72 are easily transferred to the ceramic portion 80. Accordingly, it is possible to suppress an increase in the temperature of the power elements 72. In addition, because the load receiving members 73 are positioned around the power elements 72, the load applied to the circuit board body 71 is restrained from being applied to the power elements 72 during the board junction step.

(2) The circuit board 70 is configured such that the conductive portions 81 of the ceramic portion 80 are in contact with the back surface metal junction portions 71G of the circuit board body 71. With this configuration, the heat of the power elements 72 is transferred to the conductive portions 81 through the back surface metal junction portions 71G. Therefore, the heat of the power elements 72 is easily transferred to the ceramic portion 80.

(3) The circuit board 70 is configured such that the terminal supporting members 77 are located at the portions inside the circuit board body 71, which correspond to the bus bar connectors 75. With this configuration, the terminal supporting members 77 receive a load applied to the circuit board body 71 through the bus bar connectors 75 when the end of the copper plate 31 of the bus bar 30 is fitted to the bus bar connectors 75. This suppresses deformation of the circuit board body 71.

(4) The circuit board 70 is configured such that the terminal supporting member 77 is located at the portion inside the circuit board body 71, which corresponds to the resolver connector 76. With this configuration, the terminal supporting member 77 receives a load applied to the circuit board body 71 through the resolver connector 76 when the connection terminals 53B of the resolver 50 are fitted to the resolver connector 76. This suppresses deformation of the circuit board body 71.

(5) As a circuit board configuration of a motor unit, a conventional configuration described below has been known. The conventional circuit configuration includes a flat plate-shaped first circuit board, which is fixed to a motor bracket and has power elements, a power supply module formed by combining control elements and an external connector into a module, and a flat plate-shaped second circuit board having circuit elements that control the operations of the power elements. The power supply module is located above the first circuit board in the upward direction ZA1. The second circuit board is located above the power supply module in the upward direction ZA1. Thus, the conventional circuit configuration is large in the axial directions ZA.

In contrast to this, the circuit board 70 according to the present embodiment has a configuration in which the power elements 72, the control elements 74, and the external connector 78 are fitted to the circuit board body 71. In other words, the circuit board 70 corresponds to a configuration formed by integrating together the first circuit board, the power supply module, and the second circuit board in the conventional circuit configuration. Therefore, the circuit board 70 is made smaller than the conventional circuit configuration.

(6) The circuit board 70 is configured such that the control elements 74 are arranged so as to be adjacent to the peripheral edge of the circuit board body 71. With this configuration, the width of the circuit board 70 is smaller than that in the configuration in which the control elements 74 are mounted on the main surface 71A of the circuit board body 71.

(7) The control device 1B is configured such that the control elements 74 are in contact with the supporting wall portion 115 of the gear housing 110. With this configuration, the heat of the control elements 74 is transferred to the supporting wall portion 115. Therefore, it is possible to suppress an increase in the temperature of the control elements 74.

(8) The motor unit 1 is configured such that the circuit board 70 is fixed to the gear housing 110. With this configuration, the gear housing 110 is farther from the stator 20 than the motor bracket 60, so that the gear housing 110 is less likely to be influenced by the heat of the stator 20. In addition, the volume of the gear housing 110 is larger than the volume of the motor bracket 60. Therefore, the heat of the power elements 72 is easily transferred to the gear housing 110. Accordingly, it is possible to suppress an increase in the temperature of the power elements 72.

The invention includes embodiments other than the foregoing embodiment. As other embodiments of the invention, modifications of the foregoing embodiment will be described. Note that, the following modifications may be combined with each other.

In the circuit board 70 according to the above-described embodiment, the connector cases 75B of the bus bar connectors 75 and the connector case 76B of the resolver connector 76, and the resin covering portion 79 are separately formed. Alternatively, in the circuit board 70 in a modified embodiment, at least either the connector cases 75B of the bus bar connectors 75 or the connector case 76B of the resolver connector 76 may be formed integrally with the resin covering portion 79.

The bus bar connectors 75 in the above-described embodiment have the connector cases 75B. Alternatively, the bus bar connectors 75 in a modified embodiment need not have the connector cases 75B.

The resolver connector 76 in the above-described embodiment has the connector case 76B. Alternatively, the resolver connector 76 in a modified embodiment need not have the connector case 76B.

The circuit board 70 in the above-described embodiment has the terminal supporting members 77. Alternatively, the circuit board 70 in a modified embodiment need not have at least either the terminal supporting members 77 corresponding to the bus bar connectors 75 or the terminal supporting member 77 corresponding to the resolver connector 76.

The circuit board 70 in the above-described embodiment has the columnar load receiving members 73. Alternatively, the circuit board 70 in a modified embodiment may have the load receiving members 73 having a polygonal prism shape, such as a quadratic prism shape.

The circuit board 70 in the above-described embodiment has the metal load receiving members 73. Alternatively, the circuit board 70 in a modified embodiment may have resinous load receiving members 73.

The circuit board 70 in the above-described embodiment is configured such that the load receiving members 73 are disposed around the power elements 72. Alternatively, the circuit board 70 in a modified embodiment may be configured such that the load receiving members 73 are disposed around circuit elements other than the power elements 72 inside the circuit board body 71.

The circuit board 70 in the above-described embodiment is configured such that the conductive portions 81 are formed in the ceramic portion 80. Alternatively, the circuit board 70 in a modified embodiment may be configured such that the conductive portions 81 are omitted from the ceramic portion 80.

The circuit board 70 in the above-described embodiment has the film capacitor 74A, the toroidal coil 74B, and the relay 74C as the control elements 74. Alternatively, the circuit board 70 in a modified embodiment may be configured to have one or two of the film capacitor 74A, the toroidal coil 74B and the relay 74C as the control elements 74.

The circuit board 70 in the above-described embodiment has the inverter circuit formed of the power elements 72 and the control circuit that controls the operations of the power elements 72. Alternatively, the circuit board 70 in a modified embodiment may be configured to have a first circuit board that has the inverter circuit formed of the power elements 72 and a second circuit board having a control circuit that controls the operations of the power elements 72. The first circuit board and the second circuit board may be separately formed. The first circuit board may be fixed to the supporting wall portion 115 of the gear housing 110. The second circuit board may be fixed to the bottom wall 62 of the motor bracket 60.

The circuit board 70 in the above-described embodiment is joined to the ceramic portion 80 over the entire circuit board body 71. Alternatively, the circuit board 70 in a modified embodiment may be joined to the ceramic portion 80, at portions where the power elements 72 of the circuit board body 71 are located. The portions other than the portions where the power elements 72 of the circuit board body 71 are located may be fixed to the supporting wall portion 115 of the gear housing 110 by, for example, an adhesive agent.

The circuit board 70 in the above-described embodiment has the ceramic portion 80 made of alumina. On the other hand, the circuit board 70 in a modification may have a ceramic portion 80 that is made of aluminum nitride, silicon nitride, or a composite formed of at least two of alumina, aluminum nitride and silicon nitride.

The circuit board 70 in the above-described embodiment has the ceramic portion 80 formed by aerosol deposition. Alternatively, the circuit board 70 in a modified embodiment may have the ceramic portion 80 formed by one of thermal spraying, chemical vapor deposition (CVD) and sputtering.

The circuit board 70 in the above-described embodiment is configured such that the control elements 74 are joined to the main surface metal junction portions 71F of the circuit board body 71 by wire bonding. Alternatively, the circuit board 70 in a modified embodiment may be configured such that the control elements 74 are joined to the main surface metal junction portions 71F of the circuit board body 71 by resistance welding or laser welding.

The circuit board 70 in the above-described embodiment has an arc shape in a bottom view of the gear housing 110. Alternatively, the circuit board 70 in a modified embodiment may be formed by bending a flat plate into an arc shape.

The control device 1B in the above-described embodiment is formed integrally with the electric motor 1A. Alternatively, the control device 1B in a modified embodiment may be formed separately from the electric motor 1A.

In the motor unit 1 in the above-described embodiment, the motor bracket 60 and the gear housing 110 are separately formed. Alternatively, the motor unit 1 in a modified embodiment may have the motor bracket 60 and the gear housing 110 formed as a single-piece member. In the motor unit 1 in another modified embodiment, the motor bracket 60 may be omitted. In the motor unit 1 in yet another modified embodiment, the gear housing 110 may be fixed to the motor housing 40.

In the motor unit 1 in the above-described embodiment, the gear housing 110 is formed as a single-piece component. Alternatively, the motor unit 1 in a modified embodiment may have a first housing, in which the gear housing 110 supports the circuit board 70, and a second housing, which is formed separately from the first housing and which houses the worm shaft 90 and the worm wheel 100. In the motor unit 1 in another modified embodiment, the housing of the control device 1B may be configured by omitting the second housing from the gear housing 110. In the motor unit 1 in the modified embodiments, the first housing may function as "housing".

The motor unit 1 in the above-described embodiment is configured such that the circuit board 70 is fixed to the supporting wall portion 115 of the gear housing 110. Alternatively, the motor unit 1 in a modified embodiment may be configured such that the circuit board 70 is fixed to the bottom wall 62 of the motor bracket 60. The ceramic portion 80 may be formed on a surface of the bottom wall 62. Further, in the motor unit 1 in a modified embodiment, the speed reducer 1C may be omitted. In the motor unit 1 in the modified embodiments, the motor bracket 60 may function as "housing".

What is claimed is:
1. A control device, comprising:
a housing having a supporting wall portion; and
a circuit board comprising:
  a ceramic portion formed on the supporting wall portion;
  a circuit board body fixed to the ceramic portion;
  a circuit element located inside the circuit board body; and
  a plurality of load receiving members that at least partially surround the circuit element inside the circuit board body.

2. The control device according to claim 1, wherein
the circuit board body comprises a metal junction portion, which is in conduction with the circuit element, on a surface thereof facing the ceramic portion; and
the ceramic portion comprises a conductive portion that is joined to the metal junction portion.

3. The control device according to claim 1, further comprising:
a connection terminal rising from a surface of the circuit board body, the surface being on an opposite side of the circuit board body from a surface thereof facing the ceramic portion, and a terminal supporting member located at a portion inside the circuit board body, the portion corresponding to the connection terminal.

4. The control device according to claim 1, further comprising:
a multilayer printed circuit board formed of thermoplastic resin films, as the circuit board body.

5. A motor unit comprising the control device according to claim 1.

6. The motor unit according to claim 5, wherein:
the motor unit includes a motor;
the motor includes a stator;
the control device has a connection terminal electrically connected to the stator, a power element that controls driving of the motor, and a control element that controls an operation of the power element;
the connection terminal rises from a surface of the circuit board body, the surface being on an opposite side of the circuit board body from a surface thereof facing the ceramic portion;
the power element is the circuit element located inside the circuit board body; and
the control element is adjacent to a peripheral edge of the circuit board body.

* * * * *